United States Patent
Zangl et al.

(10) Patent No.: US 8,368,393 B2
(45) Date of Patent: Feb. 5, 2013

(54) MEASUREMENT METHOD, SENSOR ARRANGEMENT AND MEASUREMENT SYSTEM

(75) Inventors: Hubert Zangl, Graz (AT); Thomas Bretterklieber, Lieboch (AT); Gerald Steiner, Graz (AT); Markus Brandner, Graz (AT)

(73) Assignee: Austriamicrosystems AG, Unterpremastaetten (AT)

( * ) Notice: Subject to any disclaimer, the term of this patent is extended or adjusted under 35 U.S.C. 154(b) by 476 days.

(21) Appl. No.: 12/668,004

(22) PCT Filed: Jun. 18, 2008

(86) PCT No.: PCT/EP2008/057704
§ 371 (c)(1),
(2), (4) Date: May 10, 2010

(87) PCT Pub. No.: WO2009/007210
PCT Pub. Date: Jan. 15, 2009

(65) Prior Publication Data
US 2011/0025313 A1  Feb. 3, 2011

(30) Foreign Application Priority Data
Jul. 6, 2007  (DE) .......... 10 2007 031 511
Aug. 6, 2007  (DE) .......... 10 2007 036 984

(51) Int. Cl.
*G01B 7/30* (2006.01)
(52) U.S. Cl. .................... 324/207.25
(58) Field of Classification Search .......... None
See application file for complete search history.

(56) References Cited

U.S. PATENT DOCUMENTS

| 2,805,677 A | * | 9/1957 | Baird ............... 324/207.18 |
| 5,959,863 A | | 9/1999 | Hoyt et al. |
| 6,433,536 B1 | * | 8/2002 | Yundt et al. ........ 324/207.22 |
| 6,690,159 B2 | | 2/2004 | Burreson et al. |
| 7,208,939 B2 | * | 4/2007 | Frederick et al. ...... 324/207.25 |
| 2002/0077752 A1 | | 6/2002 | Burreson et al. |
| 2005/1027813 | | 12/2005 | Hammerschmidt et al. |

FOREIGN PATENT DOCUMENTS

| DE | 10 2004 024 398 | 12/2005 |
| DE | 10 2006 042 725 | 3/2008 |

(Continued)

OTHER PUBLICATIONS

S.M. Kay, "Fundamentals of Statistical Signal Processing: Detection Theory", Prentice Hall Signal Processing Series, Prentice Hall, pp. 80-83, 1998.

(Continued)

*Primary Examiner* — Paresh Patel
(74) *Attorney, Agent, or Firm* — Cozen O'Connor

(57) ABSTRACT

In a measurement method, an array of magnetic field sensors (MS0-MS15) is provided, each emitting a sensor signal as a function of magnetic field intensity. A rotational value of a sector-wise magnetized magnetic source that is arranged movably with respect to the array is ascertained as a function of the emitted sensor signals. A set of sensor values is derived from the sensor signals. As a function of the ascertained rotational value, a number of sets of reference values is ascertained that corresponds to a number of predetermined positions of the magnetic source (MAG). The set of sensor values and the number of sets of reference values are compared to one another, and a position is selected from the number of predetermined positions as a function of the comparison.

20 Claims, 5 Drawing Sheets

FOREIGN PATENT DOCUMENTS

| | | |
|---|---|---|
| EP | 0 621 493 | 10/1994 |
| WO | WO 00/23824 | 4/2000 |
| WO | WO 2005/047823 | 5/2005 |
| WO | WO 2008/031725 | 3/2008 |

OTHER PUBLICATIONS

S. M. Kay, "Fundamentals of Statistical Signal Processing Estimation Theory", Prentice Hall Signal Processing Series, Prentice Hall, pp. 46-47, pp. 220-227, 1993.

C. Steele et al., "An Ultraminiature Rotary Encoder", Sensorsmag, pp. 1-7, Sep. 19, 2002.

R. Steiner et al., "Offset reduction in Hall devices by continuous spinning current method", Sensors and Actuators A: Physical, pp. 167-172, Apr. 1998.

H. Zangl, "Design Paradigms for Robust Capacitive Sensors", PhD Thesis, Graz University of Technology, Graz, Austria, May 2005.

* cited by examiner

Fig 10

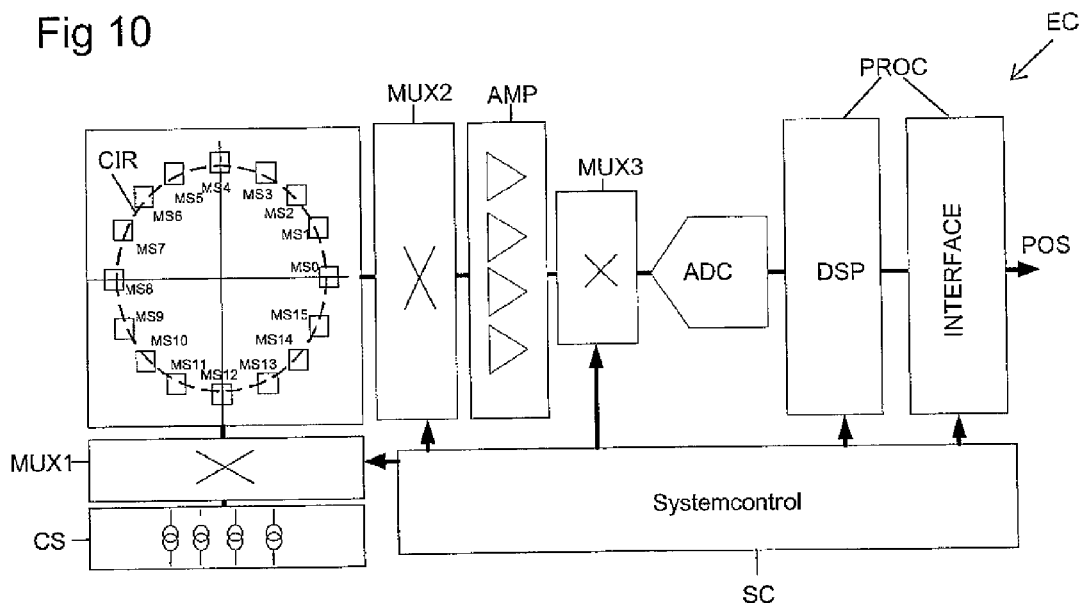

Fig 11

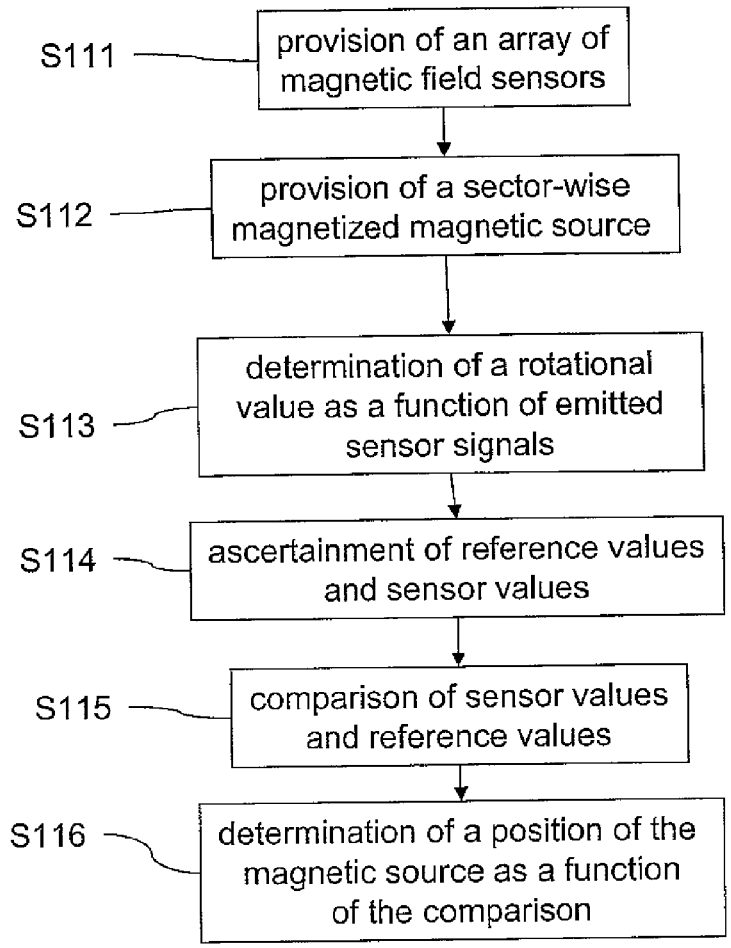

S111 — provision of an array of magnetic field sensors

S112 — provision of a sector-wise magnetized magnetic source

S113 — determination of a rotational value as a function of emitted sensor signals S114 — ascertainment of reference values and sensor values S115 — comparison of sensor values and reference values S116 — determination of a position of the magnetic source as a function of the comparison

MEASUREMENT METHOD, SENSOR ARRANGEMENT AND MEASUREMENT SYSTEM

RELATED APPLICATIONS

This is a U.S. national stage of application No. PCT/EP20081057704, filed on Jun. 18, 2008.

This application claims the priority of German application nos. 10 2007 031 511.4 filed Jul. 6, 2007 and 10 2007 036 984.2 filed Aug. 8, 2007, the entire content of both of which is hereby incorporated by reference.

FIELD OF THE INVENTION

The invention relates to a measurement method, a sensor arrangement for use with a sector-wise magnetized magnetic source, and a measurement system using the sensor arrangement.

BACKGROUND OF THE INVENTION

Sensor arrangements that comprise magnetic field sensors for measuring a magnetic field intensity can be used to determine an angular deviation of a magnetic source in relation to the position or orientation of the magnetic field. Diametrically magnetized and rotatably seated magnetic sources are frequently used for this.

For example, the magnetic field sensors can be arranged along a circular periphery and provide signals over this periphery that form approximately a sinusoidal curve, depending on the position and orientation of the magnetic source. With diametrically magnetized magnets it is possible, for example, to evaluate sensor signals from magnetic field sensors that are arranged roughly at a right angle with respect to the circular periphery. In this manner, based on the measured sensor signals, an angle of rotation of the magnetic source in relation to the arrangement of the magnetic field sensors can be determined.

In addition to a rotation about the axis, which is perpendicular to the surface formed by the circular periphery, the magnetic source can have more degrees of freedom with respect to its movement. For example, the magnetic source can be tilted about additional axes, or displaced along coordinate axes. The magnetic source can thus assume various positions as a function of these degrees of freedom.

SUMMARY OF THE INVENTION

One object of the invention is to provide a method that can be realized with low expense for determining a position of a magnetic source. Another object of the invention is to provide an arrangement that is suitable for determining the position of a magnetic source with low expense.

In one example of a measurement method, an array of magnetic field sensors is provided, each emitting a sensor signal as a function of magnetic field intensity. In addition, a sector-wise magnetized magnetic source is provided that is arranged movably with respect to the array. A rotational value of the magnetic source relative to the array of magnetic field sensors is determined as a function of the emitted sensor signals. A set of sensor values is additionally derived from the sensor signals. As a function of the ascertained rotational value, a number of sets of reference values is ascertained that correspond to a number of predetermined positions of the magnetic source. A comparison operation between the set of sensor values and the number of sets of reference values is performed, and a position from the number of predetermined positions is selected as a function of the comparison operation.

The magnetic source here can be a diametrically magnetized magnetic source that accordingly comprises a north pole and a south pole.

The number of magnetic field sensors provided in the array emits a corresponding number of sensor signals that have an analog or a digital signal form, depending on the embodiment. In the derivation of the set of sensor values, a defined number of sensor values, equal to or less than the number of sensor signals, are ascertained from the sensor signals available. This number of sensor values then forms a set that is used for the further processing. Among other things, individual sensor signals can be combined into one sensor value in the derivation, this taking place by summation or by subtraction. The derivation of the sensor values can also comprise an analog-to-digital conversion of the sensor signals. The derivation of the sensor values can further comprise being able to associate given sensor signals with respective given sensor values. Preferably, the number of sensor values in the set of sensor values and a respective number of reference values in the sets of reference values correspond, while the number of sensor signals can deviate from said number.

The position of the magnetic source, which can be determined by the method, results from the movements of the magnetic source within several degrees of freedom. Thus, for example, the magnetic source can be rotated or tilted about the three coordinate axes in three-dimensional space. The magnetic source can additionally be moved along each of the three coordinate axes. Both the tilting or rotation and the displacement of the magnetic source can start from an original starting position or reference position. The position of the magnetic source can thus have several tilting components such as the rotational value about an axis of rotation perpendicular to the arrangement of magnetic field sensors, which can be referred to as the z-axis, or the tilting about an x-axis or a y-axis, which together with the z-axis form a rectangular coordinate system. The tilting components here can take on both positive and negative values.

The position of the magnetic source can also be expressed by displacement components along the x-axis or the y-axis in both the negative and the positive direction. Additionally, a displacement along the z-axis can represent a displacement component that corresponds, for example, to a pressure function or a tension function of the magnetic source in the direction of the axis of rotation of the magnetic source.

The predetermined positions of the magnetic source in the various embodiments can also be understood to mean respective position ranges that comprise several discrete positions. For example, the number of predetermined positions results from a respective collection of various possible positions of the magnetic source within the respective degrees of freedom.

Reference values can be determined for each of the positions or position areas. The determination can be done, for example, by a measurement via a reference sensor or a reference sensor arrangement for the predetermined or possible positions. Alternatively, the reference values can be derived by a calculation or simulation of the magnetic source's magnetic field. A finite element model can be used for this, for example. From the reference values obtained in this manner, it is possible to derive the sets of reference values, each of which corresponds to one of the predetermined positions of the magnetic source.

To determine the position of the magnetic source from the sensor signals or the set of sensor values determined from them, it is possible to perform an estimate or a detection of the set of reference values with which the sensor values, i.e., the set of sensor values, best agree. In other words, one can determine from the estimation or detection the predetermined position to which the sensor values most closely correspond. For each of the sets of reference values, a probability that the sensor values in the set coincide with the reference values is determined. In other words, a confidence value can be ascertained for each of the sets of reference values or for each of the predetermined positions, which provides a measure of the probability that the magnetic source has assumed the respective position.

Consequently, the set of reference values or the position from among the predetermined positions that has the best estimation result or detection result can be selected as the position of the magnetic source. The position can accordingly be selected as a function of an extreme value, for example, a minimal value or a maximal value of the ascertained confidence values or the ascertained probabilities. For instance, the position can be determined by methods that use the principle of nearest neighbor detection (NND) or maximum a posteriori (MAP) detection.

In order to be able to reduce the cost of the method further, the reference values can be approximated in additional embodiments. For example, the values obtained metrologically or by means of field calculation can be represented by approximation functions The reference values can be approximated, for instance, by a polynomial approximation and/or by a Taylor series expansion. The cost of determining the position can be further reduced by such approximations, while the accuracy of the method is substantially unchanged A measurement arrangement in one embodiment comprises an array of magnetic field sensors, each set up to emit a sensor signal as a function of a magnetic field intensity. In addition, an evaluation unit coupled to the array of magnetic field sensors is provided and is set up to determine a rotational value, ascertain sets of reference values as a function of the rotational value and perform a comparison operation as a function of the reference values and the sensor signals, as well as to select a position as a function of the comparison operation according to one of the above-described embodiments The magnetic field sensors can comprise Hall sensors, for example. The evaluation unit that processes the sensor signals emitted by the magnetic field sensors comprises, for instance, one or more analog-to-digital converters, a memory device, a digital signal processor and/or a microcontroller. The sensor signals can thus be processed, for instance, in the signal processor and/or in the microcontroller. Alternatively or additionally, the sensor signals can also be processed in a field programmable gate array (FPGA), or in other dedicated hardware. Thus the position of a magnetic source that can be used with the sensor arrangement can be determined precisely and with low cost.

One embodiment of a measurement system comprises a sensor arrangement according to one of the above-described embodiments as well as a sector-wise magnetized magnetic source that is movably arranged with respect to the array of the sensor arrangement.

In one embodiment of the measurement system, the magnetic source is coupled mechanically to a lever. The lever serves, for example, as an input device or a control device. The measurement system can be comprised for example, by a joystick that is connectable to a system for electronic data processing.

BRIEF DESCRIPTION OF THE DRAWINGS

Several embodiments of the invention are described below with reference to the figures. Elements with identical function or effect bear identical reference numbers.

In the drawings:

FIG. 10 shows a second embodiment of a sensor arrangement, and FIG. 11 shows an exemplary process diagram of a measurement method.

DETAILED DESCRIPTION OF THE DRAWINGS

Figure 1:
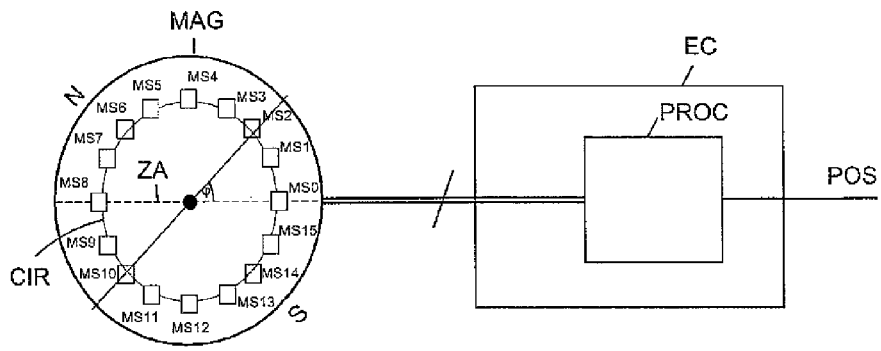
FIG. 1 shows a first embodiment of a sensor arrangement.

FIG. 1 shows an embodiment of a sensor arrangement that comprises an array of magnetic field sensors MS0-MS15 that are uniformly arranged along a circular periphery CIR. Magnetic field sensors MS0-MS15 are coupled to an evaluation unit EC having a computation unit PROC, for example, a microcontroller. Magnetic field sensors MS0-MS15 are each set up to emit a sensor signal as a function of the magnetic field intensity. The sensor signal can be emitted, for example, as an analog voltage or current signal, which can be converted into a digital value by an analog-to-digital converter, not shown here, for further processing. Such an analog-to-digital converter can, for example, be provided directly at the magnetic field sensors MS0-MS15, or alternatively, can be comprised by the evaluation unit EC. The sensor arrangement illustrated in FIG. 1 can be used with a sector-wise magnetized magnetic source MAG, which in this case is embodied as a diametrically magnetized magnetic source with a respective north pole and south pole. In other embodiments, magnetic sources with several sectors can be used, so that the magnetic source has more than one north pole and more than one south pole. In other words, a magnetic source with an arbitrary number of poles can be used.

In the evaluation unit EC, the sensor signals of the magnetic field sensors MS0-MS15, constructed for example, as Hall sensors, can be evaluated to initially ascertain a rotational value $\phi$ of the magnetic source MAG in relation to a reference axis ZA of the array of magnetic field sensors MS0-MS15. As a function of the ascertained rotational value $\phi$, a number of K sets of reference values, which are respectively associated with K predetermined positions of the magnetic source MAG in three-dimensional space, are ascertained in the evaluation unit EC. Each set of reference values comprises N values. N is also the number of sensor values. From the sensor signals, a set of N sensor values is derived that is compared in a comparison operation to each of the ascertained K sets of reference values. A set of reference values that represents a position POS, which is one of the predetermined positions of the magnetic source MAG, is selected from the comparison result. The selected set of reference values is, for example, the one that provides the least error from the comparison operation.

Figure 2:
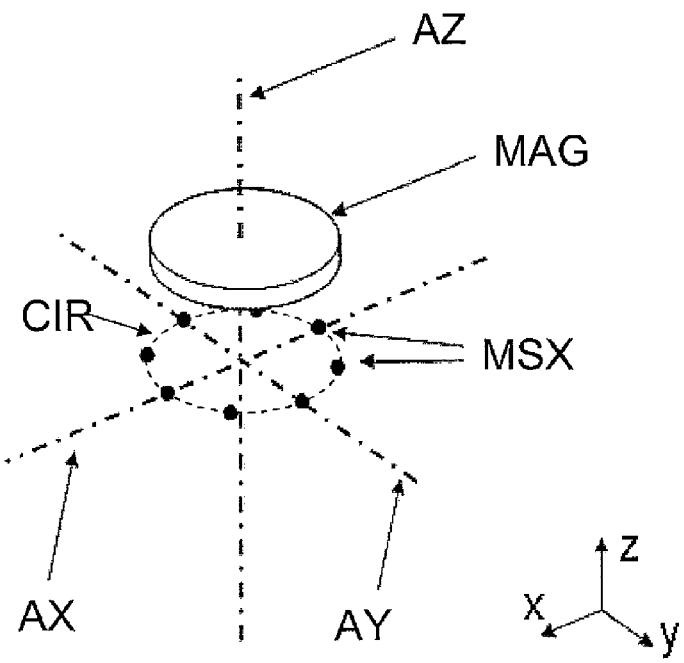
FIG. 2 shows a schematic representation of one embodiment of magnetic field sensors with a magnet source.

FIG. 2 shows a schematic representation of the array of magnetic field sensors, which in this embodiment comprises eight magnetic field sensors MSX that are arranged along the circular periphery CIR. A magnetic source MAG that is arranged movably with respect to the array is also represented. Additionally, an x-axis AX, a y-axis AY and a z-axis AZ are represented as coordinate axes of a three-dimensional coordinate system x, y, z. The circular periphery CIR lies, for instance, in a plane spanned by the axes AX and AY, or in a plane that is substantially parallel to the aforementioned plane. The magnetic source MAG is, for instance, seated rotatably about the z-axis AZ, so that a position of the magnetic source depends on an angle of rotation about the z-axis AZ. Furthermore, the magnetic source MAG can also be tilted about the x-axis AX and/or the y-axis AY, so that the position of the magnetic source MAG also depends on the respective tilting. In addition to the rotation and the tilting the position of the magnetic source MAG can also depend on a displacement along one of the axes AX, AY, AZ. In this embodiment, a total of 6 degrees of freedom for describing a position of the magnetic source MAG results from the possibility of rotation, the two tilting possibilities, and the three displacement possibilities.

As a function of the respective position of the magnetic source MAG, respective magnetic field intensities can be produced at the respective magnetic field sensors MSX and can be converted by the magnetic field sensors MSX into corresponding sensor signals.

Figure 3:
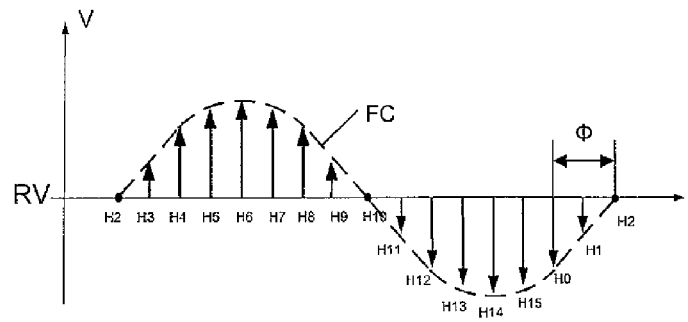
FIG. 3 shows a first exemplary diagram of magnetic field intensities.

FIG. 3 shows an exemplary diagram with a sinusoidal curve FC of magnetic field intensities that is formed by sensor signals or sensor values H0-H15. The sensor signals or sensor values H0-H15 are emitted, for example, by a sensor array with magnetic field sensors MS0-MS15 according to the embodiment shown in FIG. 1. The sensor signals in this embodiment are represented as voltage signals V, wherein a mean value RV, generally independent of a field intensity that is emitted by a magnetic source, results for the sinusoidal curve FC. Under the assumption that a reference axis ZA is established as in the embodiment of FIG. 1, a rotational value Φ results that can be ascertained from the sinusoidal curve FC. A set of sensor values that can be used for the above-described comparison operation with the set of reference values can be formed from the sensor values.

Figure 4:
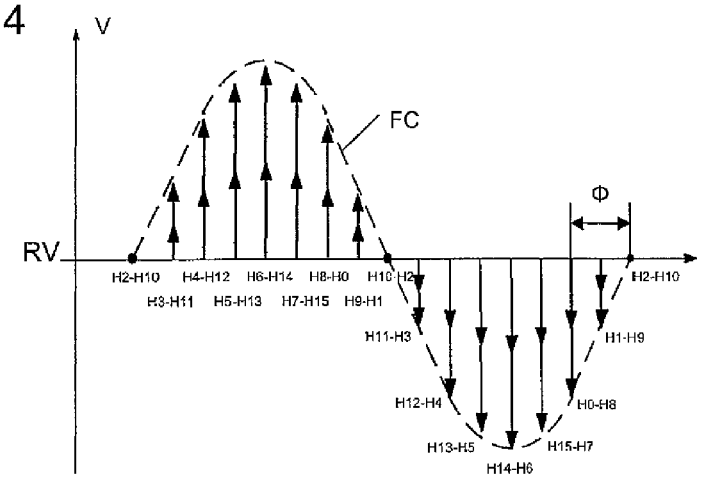
FIG. 4 shows a second exemplary diagram of magnetic field intensities.

FIG. 4 shows an additional exemplary diagram of a sinusoidal curve FC that results from sensor signals or sensor values H0-H15 of corresponding magnetic field sensors MS0-MS15. Sensor signals from opposing or spatially shifted by 180° magnetic field sensors are combined with one another or subtracted from one another. The sensor values arising from combination or subtraction are thereby less sensitive to magnetic interference fields, which act essentially uniformly on all the magnetic field sensors.

A rotational value of the magnetic source MAG can be determined by various methods from the sensor signals or sensor values illustrated in FIGS. 3 and 4. For example, the corresponding rotational value can be derived by a Fourier analysis or Fourier transform of the sensor signals. Alternatively, the rotational value can also be determined by means of trigonometric functions as a function of the sensor signals or sensor values.

Figure 5:
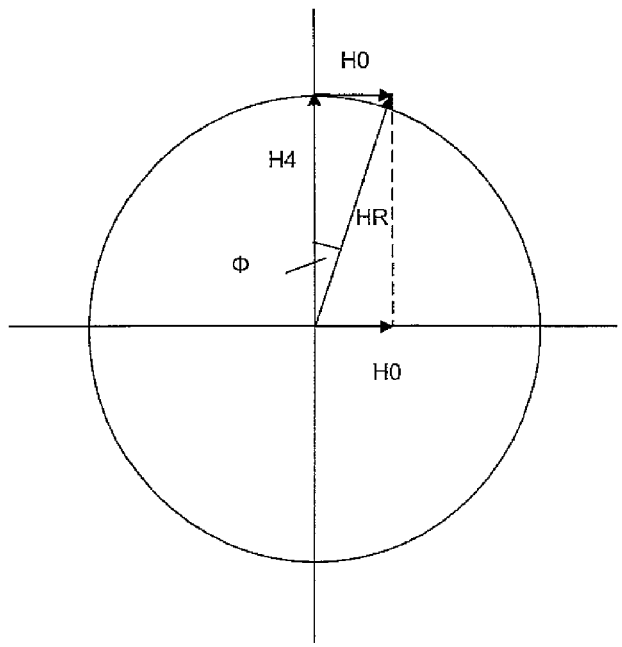
FIG. 5 shows a first exemplary diagram with vectors of intermediate signals for calculating a rotational value.

FIG. 5 shows a vector diagram with vectorially represented sensor signals H0, H4, the sum of which yields a resultant vector of a magnetic field intensity HR. The sensor values H0, H4 are emitted in this case by mutually perpendicular magnetic field sensors M0, M4 corresponding to the embodiment illustrated in FIG. 1. The rotational value results according to the diagram illustrated in FIG. 5 as, for instance, $$\Phi = \arctan\frac{H_0}{H_4}. \tag{1}$$

Figure 6:
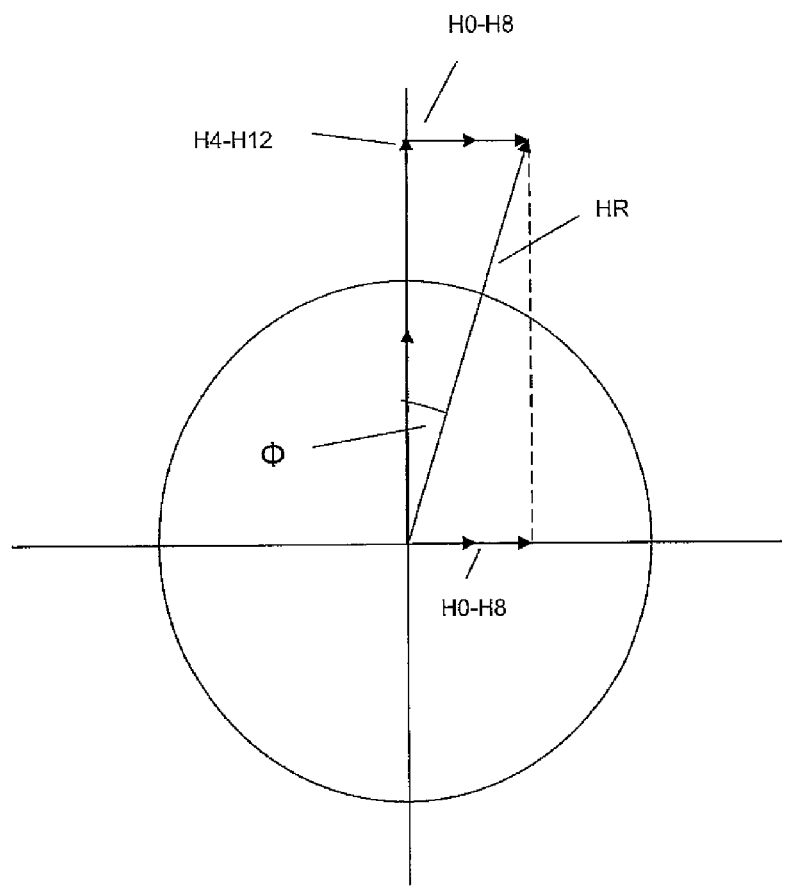
FIG. 6 shows a second exemplary diagram with vectors of intermediate signals for calculating a rotational value.

FIG. 6 shows an additional exemplary vector diagram, in which sensor signals or sensor values are combined with one another according to the diagram illustrated in FIG. 4. The resulting vector HR of the magnetic field intensity results from the sum of the mutually orthogonal components $H_4$-$H_{12}$ and $H_0$-$H_8$. The rotational value Φ can accordingly be ascertained via $$\Phi = \arctan\frac{H_0 - H_8}{H_4 - H_{12}} \tag{2}$$

Other methods for determining the rotational value Φ can also be used in addition to the methods described here.

Different positions of the magnetic source lead essentially to different field distributions of the magnetic field intensity at the magnetic field sensors. According to the embodiment illustrated in FIG. 1, they can be evaluated by comparing the sensor values that are derived from the sensor signals measured by the magnetic field sensors with reference values. Because of the uniform distribution along the circular periphery CIR, the array or the arrangement of magnetic field sensors has symmetry properties. For that reason, the resulting field distributions from different positions with a corresponding rotation are similar to one another if the rotation corresponds to an angle interval of two adjacent magnetic field sensors. The circle or the circular periphery CIR can accordingly be subdivided into several sectors that take into account the symmetry properties with respect to the field strength intensity or field distribution.

Figure 7:
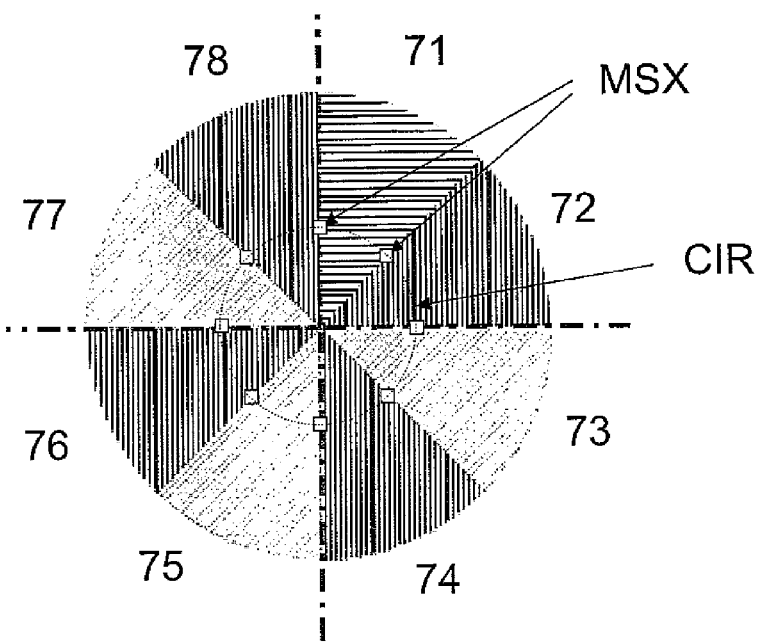
FIG. 7 shows an exemplary diagram with sectors of magnetic field intensities.

FIG. 7 shows an exemplary subdivision of the circular periphery CIR, along which eight magnetic field sensors MSX are arranged, in eight sectors 71-78. In this arrangement, the magnetic field sensors MSX would provide similar sensor signals if, for instance, there was a rotational value of the magnetic source by 10° or 100°. The sets of sensor signals in each case could essentially be considered a reordering of the respective sensor signals of the magnetic field sensors and an exchange of corresponding axes.

Accordingly, assuming ideal magnetic field sensors, sectors 73, 75 and 77 can be imaged merely by a reordering of the sequence of sensor signals at sector 71, or can be derived from sector 71. In a similar manner, sensor signals to be expected in sectors 72, 74, 76 and 78 can be derived by mirroring the corresponding sensor signals from sector 71. In the derivation of the reference values for the comparison with the sensor signals, these values can consequently be derived essentially for the first sector 71, i.e., for a rotational value inside the sector, while the reference values for the other sectors can be ascertained by simple reordering, interchange and/or mirroring of the reference values. The symmetry properties can also be taken into account directly while performing the comparison operation. In other words, the symmetry properties of the array of magnetic field sensors can be used in ascertaining sets of reference values and/or in the performance of the comparison operation.

Figure 8:
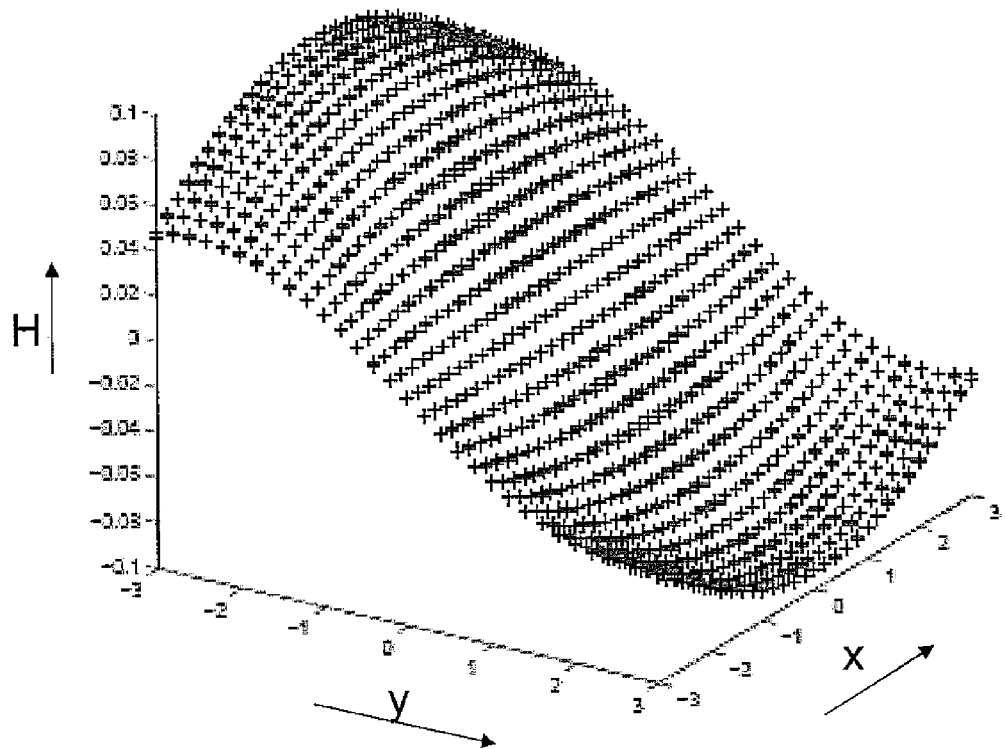
FIG. 8 shows an exemplary diagram of reference values of magnetic field intensities.

FIG. 8 shows an exemplary diagram with the curve of a magnetic field intensity H in the area of a magnetic source according to one of the above-described embodiments for a surface defined by an x-axis and by a y-axis. The diagram represents the curve of the magnetic field intensity or a possible position of the magnetic source. In the diagram, both the curve of a field distribution that is calculated with a finite element method and an approximation of the curve determined by field calculation are shown. Deviations result essentially only in boundary areas of the approximation.

A comparable field curve of magnetic field intensity could also be determined by measurement with a reference sensor or a reference sensor arrangement.

Based on the ascertained rotational value Φ, several sets $S_k$ of reference values $s_{k,i}$ can be determined for a number K of predetermined positions, where each of the sets $S_k$ comprises a number N of reference values that corresponds to a number of sensor values, or original or combined sensor signals, which are used for the comparison operation. Accordingly the index i can assume values of 1 to N, and the index k can assume values of 1 to K.

Referring to FIG. 8, a model of the magnetic field, which can also be represented by an approximation to reduce the computational cost, can be used for deriving the reference values. For example, comparatively simple mathematical functions that are parameterized in such a manner that they represent a good approximation of the actual field curve in the area under consideration are used for this purpose. Possibilities in this regard are linear or polynomial approximations such as a regression. Functions of a higher order can also be used for approximating the magnetic fields, however. The parameters for the approximation can be determined metrologically or with the aid of a field calculation, for example, a finite element simulation. To ascertain a reference value $s_{k,i}$, it is therefore possible to set up a function $f_i$ that is dependent on the rotational value Φ and one of the K predetermined positions of the magnetic source, so that $$s_{k,i} = f_i(\Phi, k) \text{ mit } i=1 \ldots N \text{ und } k=1 \ldots K \quad (3)$$

Under the assumption that Y represents a set of sensor values $Y_i$ derived from the sensor signals emitted by the magnetic field sensors, cost functions $M_i(Y)$ with $$M_i(Y) = \sum_{i=0}^{N-1} \sum_{j=0}^{N-1} M_{i,j} P(H_i | H_j) P(H_j) \quad (4)$$

can be set up, where $M_{i,j}$ stands for the costs of a decision to select a hypothesis $H_i$ under the condition that the hypothesis $H_j$ is true. Here, P(H) stands for a probability that the respective hypothesis H is correct. To select the respective position POS from the number of predetermined positions under the assumption of equal costs $M_{i,j}$ for all positions of the magnetic source, the hypothesis with the highest probability can therefore be determined taking into account the sensor values Y. Equivalently, one can select the hypothesis $H_j$ for which it holds that:

$$p(Y|H_k) > p(Y|H_i) \forall i \neq k. \quad (5)$$

With C as the covariance matrix of the measured sensor signals, this probability, assuming a Gaussian distribution of the respective uncertainties, results as $$p(Y|H_k) = \frac{1}{(2\pi)^{\frac{p}{2}}} \frac{1}{|C|^{\frac{1}{2}}} e^{-\frac{1}{2}(Y-S_k)^T C^{-1}(Y-S_k)}. \quad (6)$$

To keep low the computational cost for calculating the reference values or calculating the respective probabilities, the normally nonlinear functions of the magnetic field model can be approximated as a piecewise constant or as piecewise linear functions. For example an approximation can be held constant over a defined angle range, so that one respective segment of the subdivision illustrated in FIG. 7 can be subdivided into smaller component segments. By taking the logarithm and taking into account the assumption that the covariance matrix C of the sensor values has only slight changes, it is possible to use the following more easily implemented equation in place of equation (6):

$$\tilde{p}(Y|H_k) = -\frac{1}{2}(Y-S_k)^T C^{-1}(Y-S_k) \quad (7)$$

This can be transformed to $$\tilde{p}(Y|H_k) = \sum_{i=1}^{N} \sum_{j=1}^{N} C_{i,j} \cdot (Y_i - s_{k,i}) \cdot (Y_j - s_{k,j}), \quad (8)$$

where $C_{i,j}$ represents respective individual values of the covariance matrix C. If equation (8) is used, then a comparison operation is performed, in which the deviations between the sensor values $Y_i$ of the set Y of sensor values and the respective associated reference values $s_{k,i}$ of the sets $S_k$ of reference values are determined. Thus, probabilities or confidence values are derived for each of the predetermined positions, wherein, with reference to equation (5), the position with the highest confidence value or the highest probability is selected.

Due to the nested summation in equation (8), a quadratic summation of the deviations, which is correspondingly performed for the predetermined positions, occurs in the derivation of the probabilities or confidence values. The determination of the hypothesis with the highest probability can be referred to as a maximum likelihood method. If, as explained for equation (7), the logarithm of the corresponding probability functions is taken for this purpose, one can speak of a logarithmic likelihood method. Such likelihood methods can be summarized under the term estimation method or probability method.

In the determination of the deviations between the sensor values $Y_i$ and the reference values $s_{k,i}$, individual deviation values can have a different meaning, which can depend on the type and direction of tilting, among other things. If, for example, there is a tilt along an axis formed by two opposing magnetic field sensors, it can be expected that the sensor signals emitted by these magnetic field sensors will have or should have no substantial influence on a result of a position determination. However, if these magnetic field sensors supply sensor signals with a large magnitude, as a function of a given rotational value of the magnetic source for instance, the corresponding deviations from these sensor signals can theoretically have a greater influence than is necessary for reasons of geometry.

For this reason, weighting factors can be introduced, which for example, apply a smaller weighting factor to such deviations, and apply higher weighting factors to deviations that result from sensor signals of smaller magnitude, but which have a higher significance when viewed geometrically. Such weighting factors can be integrated, for example, in equation (8) into the covariance matrix $C_{i,j}$. The size or the magnitude of the respective weighting factors can be derived metrologically and/or by means of field calculation, similarly to the reference values. The weighting factors that are respectively used depend in turn on the ascertained rotational value.

The weights for the individual sensor values can be ascertained according to various methods, wherein the tolerances to which a sensor arrangement with the described measurement methods should be insensitive play an essential role. For a theoretical ideal sensor without mechanical, magnetic or electronic tolerances and without noise, all weights can be set to the same value. Since this case cannot be realized in practice however, a suitable selection of the weights can be desirable for improved functioning. One possibility for determining the weights is a maximum likelihood method in which the weights are calculated from the covariance matrices of the measurement values for the respective position with a given rotation. A metrological determination and storage in tables can likewise be undertaken, but has a greater cost due to the numerous influencing factors. Accordingly, the covariance matrices can be determined analogously to the determination of the expected measurement values with the aid of approximation formulas for the magnetic field.

In a further approximation to reduce the computational cost, equation (8) can also be transformed to $$\tilde{p}(Y \mid H_k) = \sum_{i=1}^{N} W_{i,k} \cdot (Y_i - s_{k,i})^2, \quad (9)$$

where $W_{i,k}$ represent the weighting factors for the respective deviations.

In an alternative simplification of equation (8), a Taylor series expansion of equation (8) about an offset sensor value $Y_{j0}$ can be performed, which can be expressed by the equation $$\tilde{p}(Y \mid H_k) = \sum_{i=1}^{N} \sum_{j=1}^{N} C_{i,j} \cdot (Y_{j0} - s_{k,j}) \cdot (Y_i - s_{k,i}) + p(\hat{Y}_0 \mid H_k) \quad (10)$$

The final term in equation (10) represents an offset value that results from the Taylor series expansion. Equation (10), which is linearized by the Taylor series expansion, can also be written, rearranged, as $$\tilde{p}(Y \mid H_k) = \sum_{i=1}^{N} W_{i,k} \cdot Y_i + C_k, \quad (11)$$

where $W_{i,k}$ again represent weighting factors and $C_k$ is an offset value corresponding to the hypothesis $H_k$. The performance of the comparison operation is based in this case on the Taylor series expansion. However, other linear models can also be used that are able to approximate the logarithmic likelihood function or the respectively employed estimation method sufficiently well. For example, a Monte Carlo approach can be used for determining the linear approximation.

In addition to the already described methods for determining the confidence values or probabilities, additional a priori information can also be taken into account in the confidence values, by multiplying or adding additional values, for example. It may be known from an additional sensor signal or from an external source of information, for instance, that one position is more probable than another. Such information can also be expressed by appropriate weighting factors or correction factors.

In addition to the above-described comparison operations for determining or selecting the position, the size and/or the magnitude of the sensor signals and/or the sensor values can also be taken into account. For example, an average value of the sensor signals or sensor values increases if the magnetic source is moved in the direction of the array of magnetic field sensors. This can happen by pressure on the magnetic source in the specified direction, for example. The increase of the average magnitude of the sensor signals and/or the sensor values can be evaluated accordingly, so that the position is also selected as a function of the average magnitude.

Figure 9:
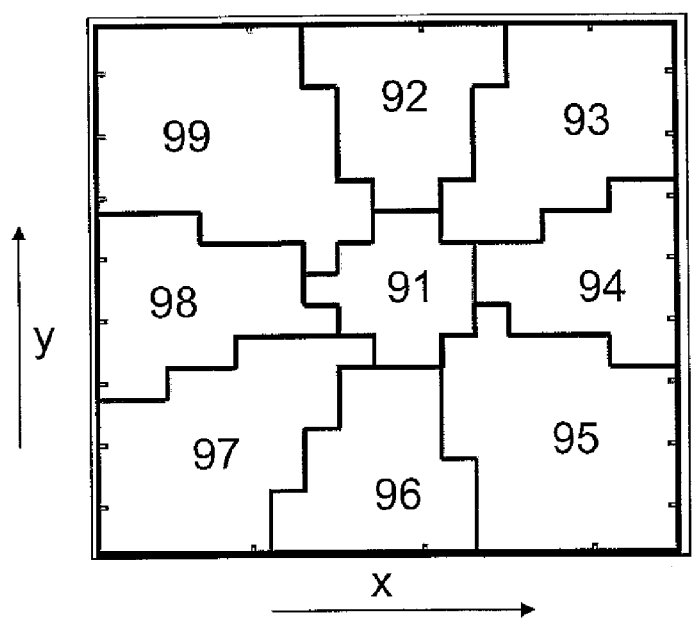
FIG. 9 shows an exemplary diagram with position ranges.

FIG. 9 shows an exemplary subdivision of theoretically possible positions of the magnetic source into different position areas, each of which corresponds to one of the predetermined positions. A respective hypothesis according to the above-described embodiment can be associated with each of the position areas or positions 91-99.

The illustrated subdivision is also a function of a respective rotational value, so that different subdivisions are possible for different rotational values. In this embodiment, nine positions or position areas are provided. With a method according to one of the above-described embodiments, however, subdivisions with more or fewer positions or position areas can be provided.

FIG. 10 shows an additional embodiment of a sensor arrangement with magnetic field sensors MS0-MS15 that are arranged along a circular periphery CIR. The sensor arrangement again has an evaluation circuit EC, which in this embodiment has a digital signal processor DSP and an interface that are comprised by a computing unit PROC. A current source CS that is coupled via a first multiplexer MUX1 to the array MS0-MS15 is also provided. On the output side, the array MS0-MS15 is coupled to the computing unit PROC via a second multiplexer MUX2, amplification devices AMP, a third multiplexer MUX3 and an analog-to-digital converter ADC. The sensor arrangement further comprises a system controller SC that controls the multiplexers MUX1, MUX1, MUX3 and the computing unit PROC.

The magnetic field sensors MS0-MS15 are constructed in this embodiment as Hall sensors that are operated with a supply current provided by the current source CS. The sensor signals that are emitted by the magnetic field sensors MS0-MS15 are supplied via the multiplexers MUX2, MUX3 and the amplification device AMP to analog-to-digital converter ADC; the sensor signals can be individually carried or can be combined with one another by appropriate connections in the amplification device AMP, even before being supplied to the analog-to-digital converter ADC.

In the evaluation unit EC, the sensor signals are processed by a method from one of the above-described embodiments, so that the position of a magnetic source, not illustrated here for reasons of clarity, can be determined. The digital signal processor DSP can also have a storage unit, for example, in which coefficients for deriving sets of reference values as well as for determining or retrieving weighting factors are stored.

Corresponding functions for ascertaining the rotational value of the magnetic source, deriving the set of sensor values, ascertaining the set of reference values, performing a comparison operation between the set of sensor values and the number of sets of reference values, and selecting a position from the number of predetermined positions as a function of the comparison operation can be realized in the evaluation circuit EC both by hardware and by appropriate programming.

FIG. 11 shows an exemplary process diagram of a method for determining a position of a magnetic source in relation to an array of magnetic field sensors. The order of the individually described steps can also be interchanged. In addition, individual steps can also be executed parallel to one another.

At S111 an array of magnetic field sensors is provided, which are constructed for example as Hall sensors. The magnetic field sensors can each emit a sensor signal as a voltage signal or current signal as a function of a magnetic field intensity.

At S112 a sector-wise magnetized magnetic source is provided, which has two or more magnetic poles, for example. Accordingly, the magnetic source can also be constructed as a diametrically magnetized magnetic source. The magnetic source is movably arranged with respect to the array of magnetic field sensors, and serves to generate a respective magnetic field intensity that can be detected by the magnetic field sensors.

At S113 a rotational value of the magnetic source with respect to a reference axis of the array is determined from the sensor signals emitted by the magnetic field sensors. The determination can take place, for example, by a Fourier analysis or by means of a trigonometric function of the sensor signals.

For further processing, corresponding sensor values are derived at S114 from the sensor signals. Additionally, reference values that can be associated with different predetermined positions of the magnetic source are derived as a function of the previously ascertained rotational value.

The derived sensor values are compared with the reference values, for example, in the framework of an estimation function or a probability function. For example, a probability value or confidence value, which indicates how probable it is that the magnetic source has assumed the respective position, is derived by the comparison operation for each of the predetermined positions.

As a function of the comparison or the ascertained probability values or confidence values, the position of the magnetic source is selected at S116. For example, the position that has the highest probability value, or at which the deviations between the reference values and sensor values are the smallest, is selected.

With a method according to one of the above-described embodiments, it is possible to determine the position of a magnet that is defined, for example, by tilting and/or displacement in such a manner that influences based on a rotation of the magnetic source can be taken into account in a simple manner. It is further possible for the determination of the position to be undertaken without calibration, even in case of rather large tolerances for different magnetic sources that are to be used.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A measurement method, comprising the steps of:
provision of an array of magnetic field sensors, each emitting a sensor signal as a function of a magnetic field intensity;
provision of a sector-wise magnetized magnetic source that is arranged movably with respect to the array;
determination of a rotational value of the magnetic source relative to the array as a function of the emitted sensor signals;
derivation of a set of N sensor values from the sensor signals;
ascertainment, based on the previously determined rotational value, of a number K of sets $S_k$ of reference values $s_{k,i}$ corresponding to a number K of redetermined positions of the magnetic source, wherein each of the sets $S_k$ comprises a number N of reference values that corresponds to the number N of sensor values, and wherein the index i can take on values from 1 to N and the index k can take on values from 1 to K;
performance of a comparison operation between the set of sensor values and the number of sets $S_K$ of reference values; and
selection of a position from the number of predetermined positions as a function of the comparison operation.

2. The measurement method according to claim 1, wherein the sets of reference values are ascertained from field values metrologically and/or by means of field calculation.

3. The measurement method according to claim 1, wherein deviations between the sensor values of the set of sensor values and the respective associated reference values of the sets of reference values are determined in the performance of the comparison operation.

4. The measurement method according to claim 3, wherein the deviations are weighted with respective weighting factors.

5. The measurement method according to claim 4, wherein the respective weighting factors are ascertained metrologically and/or by means of field calculation.

6. The measurement method according to claim 3, wherein a confidence value is derived from the ascertained deviations for each of the predetermined positions, and the position is selected as a function of an extreme value of the derived confidence values.

7. The measurement method according to claim 6, wherein the deviations for each of the sets of reference values are quadratically summed in the derivation of the confidence values.

8. The measurement method according to claim 6, wherein the confidence values are adapted by a correction factor as a function of at least one of the sensor signals and/or sensor values and/or as a function of an external information source.

9. The measurement method according to claim 1, wherein the performance of the comparison operation is based on a detection method and/or a probability method.

10. The measurement method according to claim 9, wherein the detection method and/or probability method is a maximum likelihood method or a logarithm likelihood method.

11. The measurement method according to claim 1, wherein the comparison operation is performed on the basis of a Taylor series expansion.

12. The measurement method according to claim 1, wherein the rotational value is ascertained via a trigonometric function and/or a Fourier analysis as a function of the sensor signals in each case.

13. The measurement method according to claim 1, wherein the magnetic field sensors are distributed uniformly along a circular periphery.

14. The measurement method according to claim 1, wherein symmetry properties of the array are used in ascertaining the sets of reference values and in performing the comparison operation.

15. The measurement method according to claim 1, wherein the position is also selected as a function of an average magnitude of the sensor signals and/or the sensor values.

16. A sensor arrangement for use with a sector-wise magnetized magnetic source, the sensor arrangement comprising an array of magnetic field sensors each set up to emit a sensor signal as a function of a magnetic field intensity, and an evaluation unit coupled to the array of magnetic field sensors that is configured
- to ascertain a rotational value as a function of the emitted sensor signals;
- to derive a set of N sensor values from the sensor signals;
- to ascertain, based on the previously ascertained rotational value, a number K of sets $S_k$ of reference values $s_{k,i}$ corresponding to a number K of predetermined positions of a used magnetic source, wherein each of the sets $S_k$ comprises a number N of reference values that corresponds to the number N of sensor values, and wherein the index i can take on values from 1 to N and the index k can take on values from 1 to K;
- to perform a comparison operation between the set of sensor values and the number of sets $S_k$ of reference values; and
- to select a position from the number of predetermined positions as a function of the comparison operation.

17. The sensor arrangement according to claim 16, wherein the evaluation unit is set up to ascertain deviations between the sensor values of the set of sensor values and the respective associated reference values of the sets of reference values.

18. The method according to claim 17, wherein the evaluation unit is set up to derive a confidence value for each of the predetermined positions from the ascertained deviations, and to select the position as a function of an extreme value of the derived confidence values.

19. The sensor arrangement according to claim 16, wherein the evaluation unit includes at least one of the following:
 a digital signal processor;
 a microprocessor; and
 a field programmable gate array.

20. The measurement system comprising a sensor arrangement according to claim 16 and a sector-wise magnetized magnetic source that is arranged movably with respect to the array of the sensor arrangement.

* * * * *